(12) United States Patent
Tamura

(10) Patent No.: US 8,983,013 B2
(45) Date of Patent: Mar. 17, 2015

(54) SIGNAL PROCESSING CIRCUIT AND SIGNAL PROCESSING METHOD

(71) Applicant: Fujitsu Limited, Kawasaki-shi, Kanagawa (JP)

(72) Inventor: Hirotaka Tamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/066,774

(22) Filed: Oct. 30, 2013

(65) Prior Publication Data

US 2014/0192938 A1  Jul. 10, 2014

(30) Foreign Application Priority Data

Jan. 9, 2013  (JP) .................. 2013-001896

(51) Int. Cl.
*H04L 7/00* (2006.01)
*H03M 9/00* (2006.01)
*H03K 5/00* (2006.01)
*H03M 1/12* (2006.01)

(52) U.S. Cl.
CPC ............ *H04L 7/0041* (2013.01); *H03M 9/00* (2013.01); *H03K 5/00* (2013.01); *H03M 1/1215* (2013.01); *H03K 2005/00104* (2013.01)
USPC ........................................ 375/355

(58) Field of Classification Search
USPC .......................... 375/355, 373, 362
See application file for complete search history.

(56) References Cited

U.S. PATENT DOCUMENTS

2009/0028073 A1*  1/2009  Barrett et al. ............... 370/276

FOREIGN PATENT DOCUMENTS

JP        63-1119 A      1/1988
JP        2005-223420 A  8/2005

OTHER PUBLICATIONS

Kang et al., "A 4-bit CMOS Phase Shifter Using Distributed Active Switches," IEEE Transactions on Microwave Theory and Techniques, vol. 55, No. 7, Jul. 2007, pp. 1476-1483.
Nogawa et al, "A 10-Gb/s Burst Mode CDR IC in 0.13-um CMOS," IEEE International Solid-State Circuits Conference, 2005, 20 pages.

* cited by examiner

*Primary Examiner* — Kevin Kim
(74) *Attorney, Agent, or Firm* — Arent Fox LLP

(57) ABSTRACT

A signal processing circuit includes: a delay line configured to output, to a plurality of taps, signals with different delay times obtained by delaying an input signal, respectively; and a plurality of synchronization circuits configured to sample the signals from the plurality of taps in a phase in synchronization with a clock signal, wherein each of the plurality of synchronization circuits samples a sample signal from one of the plurality of taps in different phases and outputs a plurality of output signals.

11 Claims, 12 Drawing Sheets

SIGNAL PROCESSING CIRCUIT AND SIGNAL PROCESSING METHOD

CROSS-REFERENCE TO RELATED APPLICATION

This application is based upon and claims the benefit of priority of the prior Japanese Patent Application No. 2013-001896, filed on Jan. 9, 2013, the entire contents of which are incorporated herein by reference.

FIELD

Embodiments discussed herein are related to a signal processing circuit and a signal processing method.

BACKGROUND

The improvement of system performance depends on the improvement of the performance of parts such as memory, processor, or switch large scale integrated circuits (LSI) included in a computer or information processing device and the improvement (increase in transmission capacities or decrease in transmission delays measured in units of bits per second) of the signal transmissions speed between parts or elements. For example, in order to improve the performance of a computer (server), the signal transmission rate has to be improved between a memory such as a static random access memory (SRAM) or a dynamic random access memory (DRAM) and a processor. As the performance of information processing devices such as backbone communication devices is improved, the data rate at which signals are sent or received inside or outside the devices is desired to be improved.

The related art is disclosed in Japanese Laid-open Patent Publication No. 63-1119 or Japanese Laid-open Patent Publication No. 2005-223420.

SUMMARY

According to one aspect of the embodiments, a signal processing circuit includes: a delay line configured to output, to a plurality of taps, signals with different delay times obtained by delaying an input signal, respectively; and a plurality of synchronization circuits configured to sample the signals from the plurality of taps in a phase in synchronization with a clock signal, wherein each of the plurality of synchronization circuits samples a sample signal from one of the plurality of taps in different phases and outputs a plurality of output signals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An analog-digital conversion system may include a delay line with taps, sample-hold circuit, an analog-digital conversion circuit, a temporary digital memory, and a multiplexer.

A signal processing circuit may include a first multi-tap delay line for delaying an input signal, a second multi-tap delay line for delaying a clock signal, and a plurality of clock control comparators. The data input lines of the clock control comparator are coupled to the taps of the first delay line and the clock input lines are coupled to the taps of the second delay line.

In order to increase the data rate, the data rate of the input/output (I/O) circuit in an integrated circuit may be increased from several gigabits per second to several tens of gigabits per second. For example, it is considered that the current high end server is desired to have a data rate of approximately 10 gigabits per second to 30 gigabits per second and the next generation machine is desired to have a data rate of approximately 30 gigabits per second to 60 gigabits per second.

Figure 1:
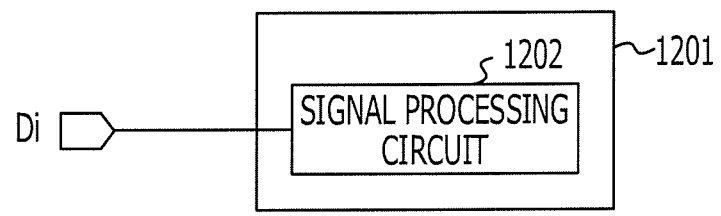
FIG. 1 depicts an example of a receiver.
Figure 2A:
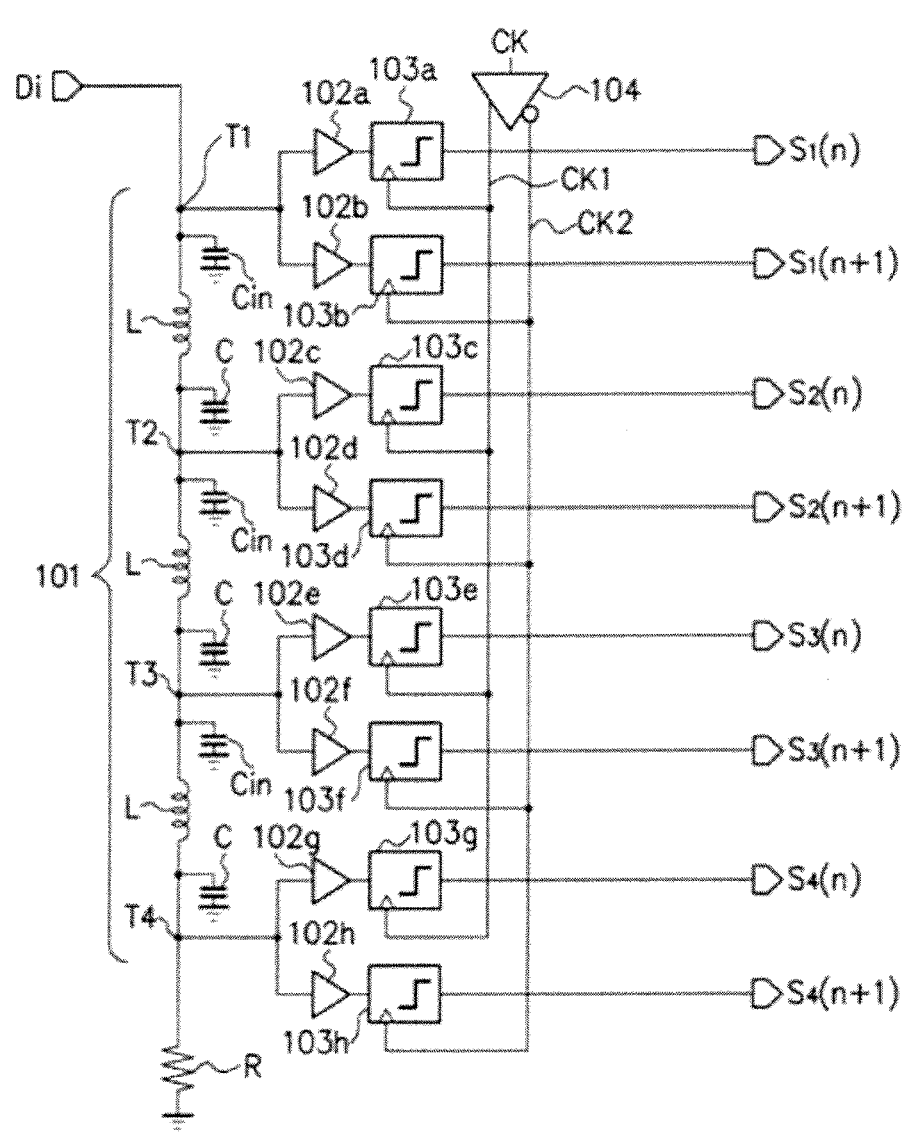
FIG. 2A depicts an example of a signal processing circuit.
Figure 2B:
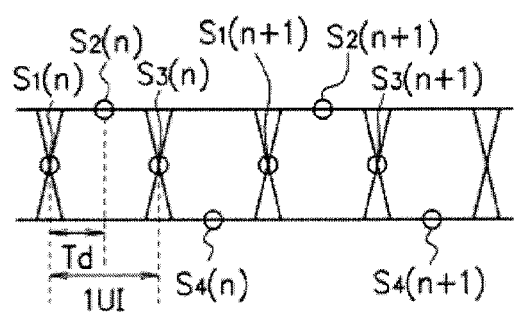
FIG. 2B depicts an example of outputs of a signal processing circuit.

FIG. 1 depicts an example of a receiver. A receiver 1201 includes a signal processing circuit 1202 and receives an input analog data signal Di. FIG. 2A depicts an example of a signal processing circuit. FIG. 2B depicts an example of outputs of a signal processing circuit. The signal processing circuit 1202 may be a front end circuit of a clock data recovery (CDR) circuit that, for example, performs one-bit determination of an input with two-times oversampling (at a sampling rate twice the data rate). The CDR circuit receives the signal Di on a transmission path, which includes data having a clock superimposed thereon and restores (reproduces) the data and signal based on the received signal Di. As depicted in FIG. 2B, the input analog signal Di may be a received signal of a no-return-to-zero (NRZ) binary code and may have a transmission rate of 64 gigabits per second. A NRZ binary code indicates a high level when data is 1 or a low level when data is 0, and does not change its level during the unit interval (1 UI). 1 UI is a one-bit time slot width (pulse width). The frequency corresponding to the data rate D (bits/second) of the data signal Di is the baud frequency fb (=D). The reciprocal (1/fb) of the baud frequency fb equals 1 UI.

The signal processing circuit includes a delay line 101, buffers 102a to 102h, synchronization circuits (latch circuits) 103a to 103h, and two-phase buffer circuit 104. The delay line 101 has four taps T1 to T4 and is terminated with a resistor R. An inductor L and capacitors C and Cin are disposed between the taps T1 and T2, between the taps T2 and T3, and between the taps T3 and T4. The resistor R is the characteristic impedance $\sqrt{L/(C+Cin)}$ of the delay line 101 and its resistance may be, for example, 50Ω. The inductor L and the capacitors C and Cin may be, for example, a parasitic inductance and parasitic capacitances, respectively. The delay line 101 delays the input analog signal Di and outputs four signals with different delays to the four taps T1 to T4. The signal from the tap T2 may be, by delay time Td, later than the signal from the tap T1. The signal from the tap T3 may be, by delay time Td, later than the signal from the tap 2. The signal from the tap T4 may be, by delay time Td, later than the signal from the tap 3. Delay time Td is, for example, 0.5 UI, which is half the unit interval 1 UI.

The buffers 102a and 102b buffer the signal from the tap T1 and output it to the synchronization circuits 103a and 103b, respectively. The buffers 102c and 102d buffer the signal from the tap T2 and output it to the synchronization circuits 103c and 103d, respectively. The buffers 102e and 102f buffer the signal from the tap T3 and output it to the synchronization circuits 103e and 103f, respectively. The buffers 102g and 102h buffer the signal from the tap T4 and output it to the synchronization circuits 103g and 103h, respectively. The buffers 102a to 102h may reduce noise generated in the delay line 101 when the synchronization circuits 103a to 103h kick back the signals.

The two-phase buffer circuit 104 outputs two-phase clock signals CK1 and CK2 based on a clock signal CK. The two-phase clock signals CK1 and CK2 have mutually reversed phases and their frequency may be, for example, 16 GHz.

The synchronization circuits 103a, 103c, 103e, and 103g sample the signals from the four taps T1 to T4, respectively, in a phase in sync with the leading edge of the clock signal CK1 (the leading edge of the clock signal CK) and outputs two-level digital data signals S1($n$), S2($n$), S3($n$), and S4($n$), respectively. The synchronization circuits 103b, 103d, 103f, and 103h, sample the signals from the four taps T1 to T4, respectively, in a phase in sync with the leading edge of the clock signal CK2 (the trailing edge of the clock signal CK) and outputs two-level digital data signals S1($n$+1), S2($n$+1), S3($n$+1), and S4($n$+1), respectively. The synchronization circuits 103a to 103h, which are latch circuits, receive an analog signal and output a high level when the input analog signal is larger than the threshold or output a low level when the input analog signal is smaller than the threshold. The data signals S1($n$) to S4($n$) and S1($n$+1) to S4($n$+1) in FIG. 1B represent sampling points.

The synchronization circuits 103a and 103b sample a single signal from the tap T1 in different phases and outputs the signals S1($n$) and S1($n$+1), respectively. The synchronization circuits 103c and 103d sample a single signal from the tap T2 in different phases and outputs the signals S2($n$) and S2($n$+1), respectively. The synchronization circuits 103e and 103f sample a single signal from the tap T3 in different phases and outputs the signals S3($n$) and S3($n$+1), respectively. The synchronization circuits 103g and 103h, sample a single signal from the tap T4 in different phases and outputs the signals S4($n$) and S4($n$+1), respectively. The synchronization circuits 103a, 103c, 103e, and 103g and the synchronization circuits 103b, 103d, 103f, and 103h, may sample signals through interleaving.

The cycle of the clock signals CK1 and CK2 may be 4 UI. The signal from tap T2 is, by delay time Td, later than the signal from tap T1. The signal from tap T3 is, by delay time 2×Td, later than the signal from tap T1. The signal from tap T4 is, by delay time 3×Td, later than the signal from tap T1. The maximum delay time for the taps T1 to T4 is delay time 3×Td in the case of the tap T4. Delay time Td may be 0.5 UI, for example. The cycle of the clock signal CK1 and CK2 is 4 UI, which is longer than the maximum delay time (3×Td (=1.5 UI)) for the signals from the taps T1 to T4.

The sampling period for the four data signals S1($n$) to S4($n$) is Td and the sampling period for the next four data signals S1($n$+1) to S4($n$+1) is also Td. The sampling period for the data signals S4($n$) and S1($n$+1) is also Td. Accordingly, the eight sampling data signals S1($n$) to S4($n$) and S1($n$+1) to S4($n$+1) are obtained for 4 UI. For example, two-times oversampling, which obtains two sampling data signals per UI, may be performed. The CDR circuit restores (reproduces) the data of each bit by selecting the data signals S2($n$), S4($n$), S2($n$+1), and S4($n$+1) in a phase near the middle of 1 UI for each bit.

The data rate of the input analog data signal Di may be 64 gigabits per second. The frequency of the clock signals CK1 and CK2 may be 16 GHz. Since the eight synchronization circuits 103a to 103h, each output the data signals of 16 gigasamples per second, the signal processing circuit outputs the data signals of 128 (=8×16) gigasamples per second. For example, the signal processing circuit may output the data signals S1($n$) to S4($n$) and S1($n$+1) to S4($n$+1) of 128 gigasamples per second by performing two-times oversampling of the input analog data signal Di of 64 gigabits per second. The two-times oversampling of the input analog data signal Di with a high data rate is performed using the 16 GHz two-phase clock signal CK1 and CK2.

When the delay times between adjacent taps of the taps T1 to T4 are Td, the four taps T1 to T4 are used to adjust a time span of 2 UI (=4×Td). Combination of time interleaving of the synchronization circuits 103a to 103h, and the delay line 101 enables the oversampling of the input analog data signal Di with a high data rate.

The input analog data signal Di is sampled using the delay line 101 with n taps. When the delay between adjacent taps is Td, the m synchronization circuits 103a and so on are coupled to one tap. The number m and number n may be larger than 2. The clock signal CK1 or so on for driving the m synchronization circuits 103a or so on may be an m-phase clock signal with a cycle of m×n×Td and the inter-phase time difference may be n×Td. For example, the m synchronization circuits 103a or so on coupled to the tap T1 or so on perform interleaving of m phases. n signals at time intervals of Td are generated and these signals are sampled at time intervals of n×Td. Combination of n-deep sampling via the delay line 101 and m-phase interleaving causes the clock cycle to become m×n×Td, which is sufficiently longer than the sampling interval.

Combination of an n-fold increase in the sampling interval by the delay line 101 with n taps and an m-fold increase in the sampling interval by the m-phase time interleaving causes an m×n-fold increase in the sampling interval. This may reduce the frequency of the clock signal CK1 for driving the synchronization circuits 103a or so on to 1/(n×m). The number of phases of the multi-phase clock signal CK1 or so on may become 1/n of the number of phases when only interleaving is used. Therefore, the power consumption of the clock system and the area may be reduced significantly.

Figure 3:
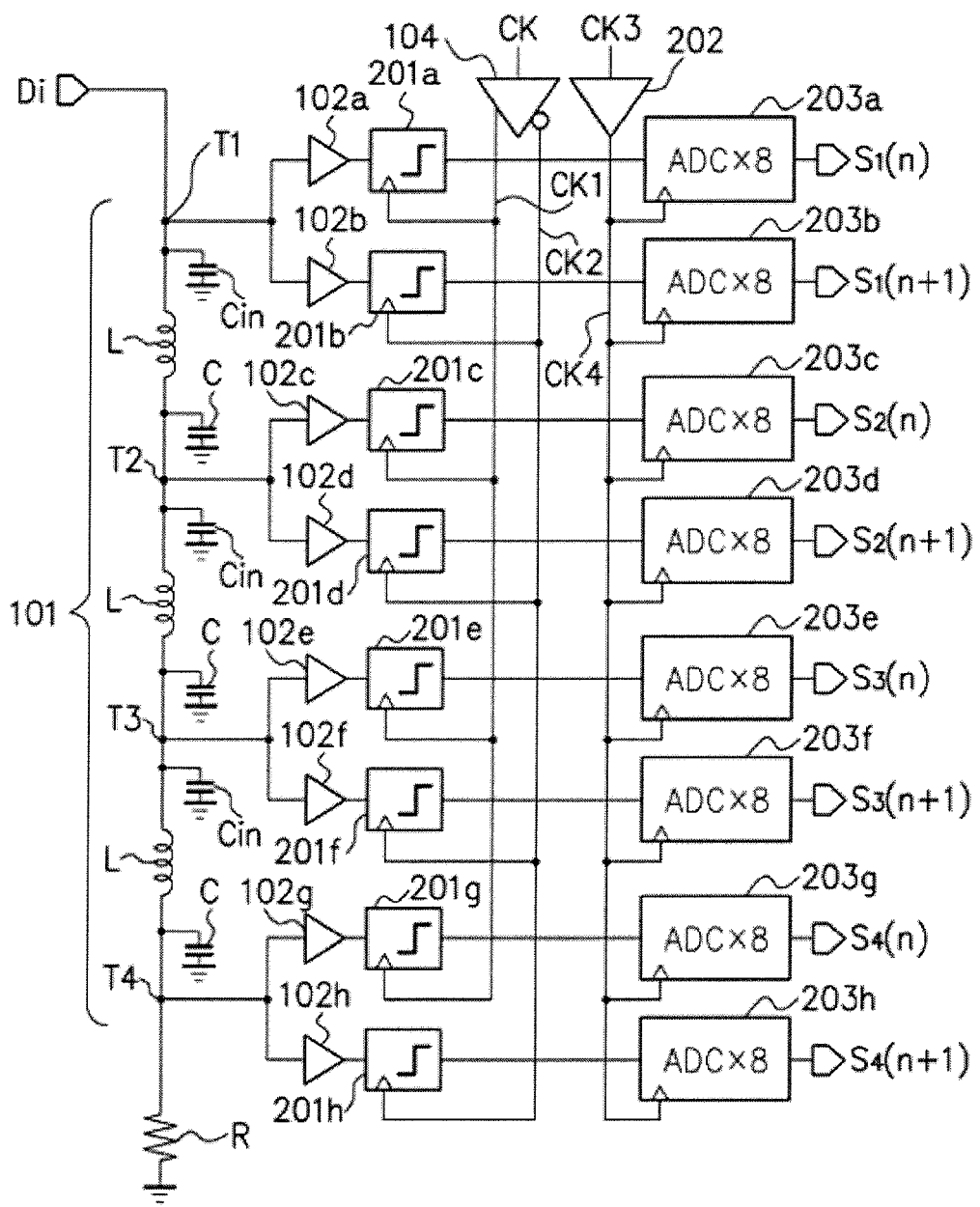
FIG. 3 depicts an example of a signal processing circuit.

FIG. 3 depicts an example of a signal processing circuit. In FIG. 3, synchronization circuits 201a to 201h are disposed in place of the synchronization circuits 103a to 103h depicted in FIG. 2A, and a buffer 202 and an analog-digital converter sets 203a to 203h are added. Since the other structure in FIG. 3 is substantially the same as or similar to that in FIG. 2A, its description may be omitted or reduced.

The synchronization circuits 201a, 201c, 201e, and 201g, which may be sampling circuits, receive analog signals from the buffers 102a, 102c, 102e, and 102g, respectively, sample the analog signals in sync with the leading edge of the clock signal CK1, and output the analog signals. The synchronization circuits 201b, 201d, 201f, and 201h, which may be sampling circuits, receive analog signals from the buffers 102b, 102d, 102f, and 102h, respectively, sample the analog signals in sync with the leading edge of the clock signal CK2, and output the analog signals.

The eight-phase buffer 202 outputs a 2 GHz eight-phase clock signal CK4 based on a clock signal CK3. The analog-digital converter set 203a includes eight analog-digital converters. The analog-digital converter set 203a performs analog-to-digital conversion of a single output signal from the synchronization circuit 201a in sync with eight phases (with different leading edges) of the eight-phase clock signal CK4 and outputs eight 4-bit digital signals S1(n). The analog-digital converter set 203b includes eight analog-digital converters. The analog-digital converter set 203b performs analog-to-digital conversion of a single output signal from the synchronization circuit 201b in sync with eight phases (with different leading edges) of the eight-phase clock signal CK4 and outputs eight 4-bit digital signals S1(n+1). The analog-digital converter set 203c includes eight analog-digital converters. The analog-digital converter set 203c performs analog-to-digital conversion of a single output signal from the synchronization circuit 201c in sync with eight phases (with different leading edges) of the eight-phase clock signal CK4 and outputs eight 4-bit digital signals S2(n). The analog-digital converter set 203d includes eight analog-digital converters. The analog-digital converter set 203d performs analog-to-digital conversion of a single output signal from the synchronization circuit 201d in sync with eight phases (with different leading edges) of the eight-phase clock signal CK4 and outputs eight 4-bit digital signals S2(n+1). The analog-digital converter set 203e includes eight analog-digital converters. The analog-digital converter set 203e performs analog-to-digital conversion of a single output signal from the synchronization circuit 201e in sync with eight phases (with different leading edges) of the eight-phase clock signal CK4 and outputs eight 4-bit digital signals S3(n). The analog-digital converter set 203f includes eight analog-digital converters. The analog-digital converter set 203f performs analog-to-digital conversion of a single output signal from the synchronization circuit 201f in sync with eight phases (with different leading edges) of the eight-phase clock signal CK4 and outputs eight 4-bit digital signals S3(n+1). The analog-digital converter set 203g includes eight analog-digital converters. The analog-digital converter set 203g performs analog-to-digital conversion of a single output signal from the synchronization circuit 201g in sync with eight phases (with different leading edges) of the eight-phase clock signal CK4 and outputs eight 4-bit digital signals S4(n). The analog-digital converter set 203h, includes eight analog-digital converters. The analog-digital converter set 203h, performs analog-to-digital conversion of a single output signal from the synchronization circuit 201h in sync with eight phases (with different leading edges) of the eight-phase clock signal CK4 and outputs eight 4-bit digital signals S4(n+1).

Each of the analog-digital converter sets 203a to 203h, performs the interleaving of eight phases in sync with the eight-phase clock signal CK4. The frequency of the eight-phase clock signal CK4 is, for example, 2 GHz, therefore, the analog-digital converter sets 203a to 203h, may convert data at a rate of 2 gigasamples per second.

The delay line 101 has n (=4) taps T1 to T4. Each of the taps T1 to T4 has m (=2) synchronization circuits 201a and 201b coupled thereto and each of the synchronization circuits 201a to 201h has p (=8) analog-digital converters coupled thereto. Each of the eight analog-digital converter sets 203a to 203h, has eight analog-digital converters and a total of 64 (=8×8) analog-digital converters are present, therefore, a 64-fold increase in the clock cycle may be obtained. Each of the 64 analog-digital converters outputs a data signal of 2 gigasamples per second in sync with the 2 GHz eight-phase clock signal CK4. A total of data signals S1(n) to S4(n) and S1(n+1) to S4(n+1) of 128 (=64×2) gigasamples per second are output. For example, the signal processing circuit may output the data signals S1(n) to S4(n) and S1(n+1) to S4(n+1) of 128 gigasamples per second by performing the two-times oversampling of the input analog data signal Di of 64 gigabits per second.

The two-times oversampling of the input analog data signal Di of 64 gigabits per second may be performed by using the 16 GHz two-phase clock signal CK1 and CK2. Due to a three-stage structure including the delay line 101, the synchronization circuits 201a to 201h, and the analog-digital converter sets 203a to 203h, a 64-fold increase in the clock cycle may be obtained as an effective value. Accordingly, the data signals are digitized by the analog-digital converter sets 203a to 203h, of 2 gigasamples per second. Since conversion into 4-bit digital signals is performed, clock signal and data are restored in the digital circuit. This may reduce the usage of analog components such as a phase interpolator for adjusting the phase of a clock signal.

Figure 4:
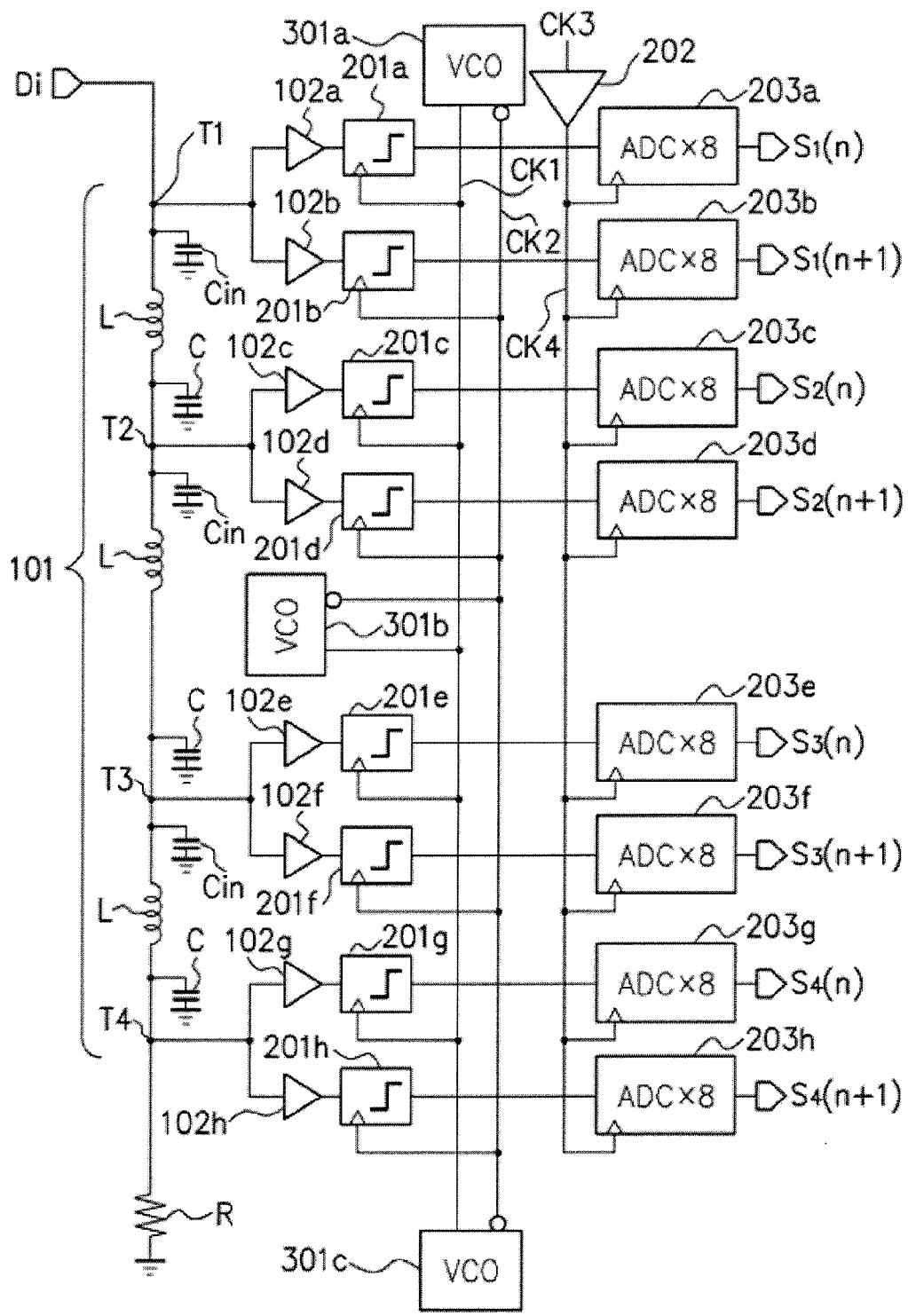
FIG. 4 depicts an example of a signal processing circuit.

FIG. 4 depicts an example of a signal processing circuit. In FIG. 4, voltage controlled oscillators (VCO) 301a to 301c are added to the signal processing circuit depicted in FIG. 3. Since the other components in FIG. 4 are substantially the same as or similar to those in FIG. 3, their description may be omitted or reduced. A plurality of, for example, three, voltage controlled oscillators 301a to 301c are coupled to each other to distribute the two-phase clock signals CK1 and CK2 to the eight synchronization circuits 201a to 201h.

Figure 5A:
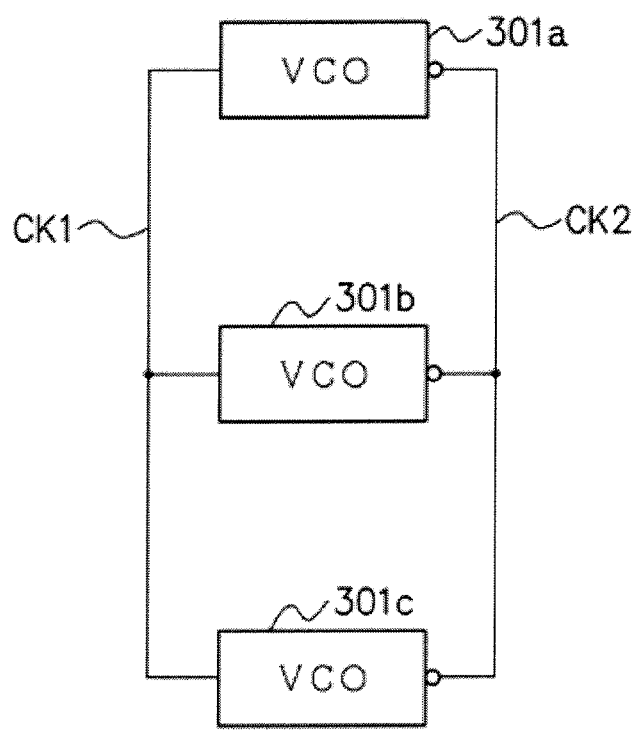
FIGS. 5A and 5B depict an example of a voltage control oscillator.
Figure 5B:
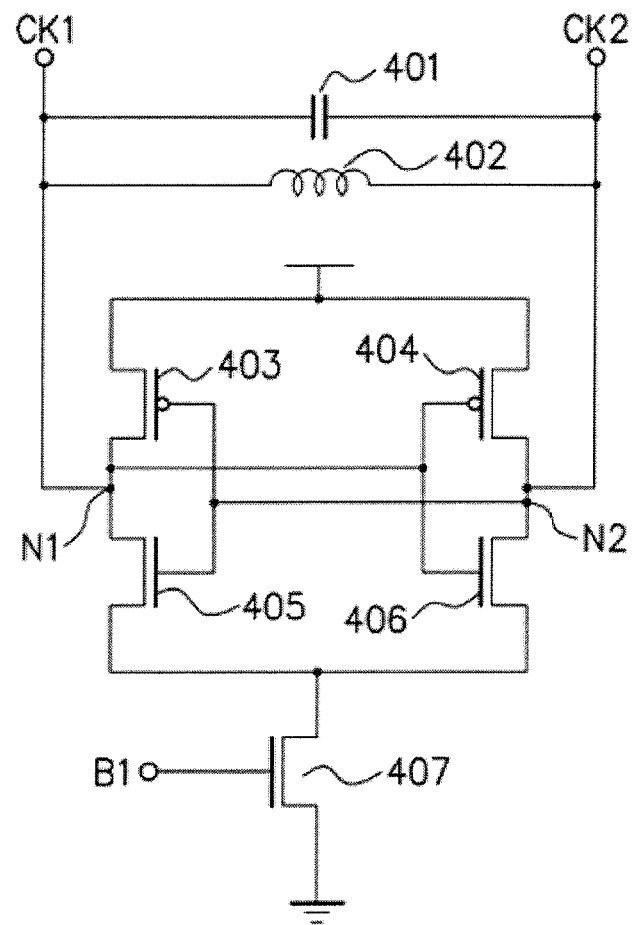

FIGS. 5A and 5B depict an example of a voltage control oscillators. FIG. 5A depicts the layout of the three voltage controlled oscillators 301a to 301c depicted in FIG. 4. The three voltage controlled oscillators 301a to 301c are aligned and coupled via wires to precisely drive the eight synchronization circuits 201a to 201h substantially at the same time. The output terminals of the plurality of voltage controlled oscillators 301a to 301c are coupled to each other and the precise clock signals CK1 and CK2 are distributed to the synchronization circuits 201a to 201h, respectively. The synchronization circuits 201a, 201c, 201e, and 201g receive the clock signal CK1 with the same phase and are driven substantially at the same time. The synchronization circuits 201b, 201d, 201f, and 201h receive the clock signal CK2 with the same phase and are driven substantially at the same time. Since the clocks are delivered at low power and high precision, timing margins of the circuits may be improved.

FIG. 5B depicts the structure of the voltage controlled oscillator 301a depicted in FIG. 3. The structure of the voltage controlled oscillators 301b to 301c depicted in FIG. 4 may also be substantially the same as that of the voltage controlled oscillator 301a. A capacitor 401 is coupled between nodes N1 and N2. An inductor 402 is coupled between the nodes N1 and N2. The source of a p-channel field effect transistor 403 is coupled to a power source voltage node, the gate is coupled to the node N2, and the drain is coupled to the node N1. The drain of an n-channel field effect transistor 405 is coupled to the node N1, the gate is coupled to the node N2, and the source is coupled to the drain of an n-channel field effect transistor 407. The source of a p-channel field effect transistor 404 is coupled to the power source voltage node, the gate is coupled to the node N1, and the drain is coupled to the node N2. The drain of an n-channel field effect transistor 406 is coupled to the node N2, the gate is coupled to the node N1, and the source is coupled to the drain of the n-channel field effect transistor 407. The gate of the n-channel field effect transistor 407 is coupled to a node of a control voltage Bi and the source is coupled to a reference voltage (ground voltage) node. The clock signal CK1 is output from the node N1 and the clock signal CK2 is output from the node N2.

Figure 6A:
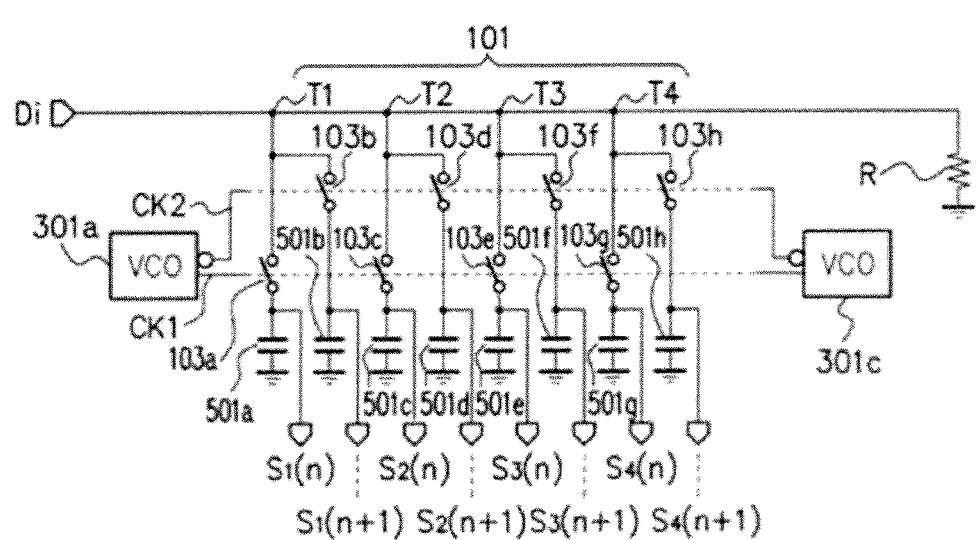
FIG. 6A depicts an example of a signal processing circuit.
Figure 6B:
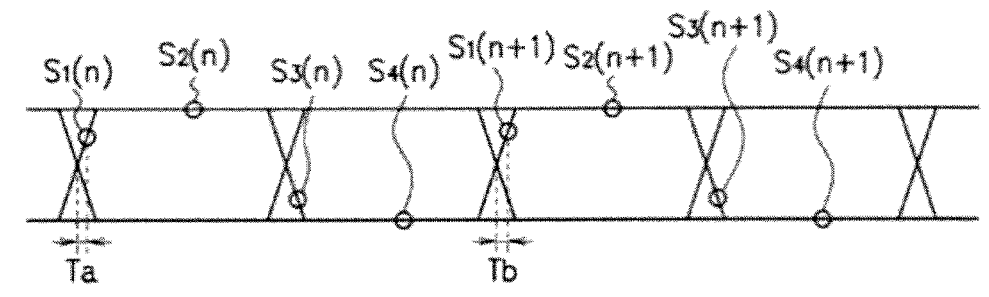
FIG. 6B depicts an example of an output of a signal processing circuit.

FIG. 6A depicts an example of a signal processing circuit. FIG. 6B depicts an example of outputs of a signal processing circuit. In FIG. 6A, the voltage controlled oscillators 301a to 301c and capacitors 501a to 501h are added to the receiver depicted in FIG. 2A. Since the other components in FIG. 6A are substantially the same as or similar to those in FIG. 1A, their description may be omitted or reduced. The synchronization circuits 103a to 103h, in FIG. 5A may correspond to the synchronization circuits 103a to 103h, in FIG. 2A. The synchronization circuits 103a to 103h, output analog signals or digital signals including a plurality of bits as the synchronization circuits 201a to 201h and/or the analog-digital converter sets 203a to 203h in FIG. 3.

The three voltage controlled oscillators 301a to 301c have the output terminals coupled to each other as in FIG. 4, distribute the clock signal CK1 with the same phase to the synchronization circuits 103a, 103c, 103e, and 103g, and distribute the clock signal CK2 with the same phase to the synchronization circuits 103b, 103d, 103f, and 103h.

The capacitors 501a, 501c, 501e, and 501g are coupled to the output terminals of the synchronization circuits 103a, 103c, 103e, and 103g, holds output signals from the synchronization circuits 103a, 103c, 103e, and 103g, and outputs them as the data signals S1(n) to S4(n), respectively. The capacitors 501b, 501d, 501f, and 501h are coupled to the output terminals of the synchronization circuits 103b, 103d, 103f, and 103h, holds output signals from the synchronization circuits 103b, 103d, 103f, and 103h, and outputs them as the data signals S1(n+1) to S4(n+1), respectively.

As depicted in FIG. 6B, a phase Ta of the data signal S1(n) is based on a start phase (data transition phase) of one bit (1 UI). A phase Tb of the data signal S1(n+1) is based on a start phase (data transition phase) of one bit (1 UI). The start phase of one bit is represented by 0 UI and obtained based on, for example, the value of the data signal S1(n). For example, if the value of the data signal S1(n) is an intermediate value between the high level and the low level, the phase of the data signal S1(n) is the start phase of one bit. If the value of the data signal S1(n) deviates from the intermediate value, the start phase of one bit is obtained based on the amount of deviation. When the delay times between adjacent taps of taps T1 to T4 of the delay line 101 are 0.5 UI, the phase interval of adjacent signals of the data signals S1(n) to S4(n) and S1(n+1) to S4(n+1) may be 0.5 UI.

Figure 7:
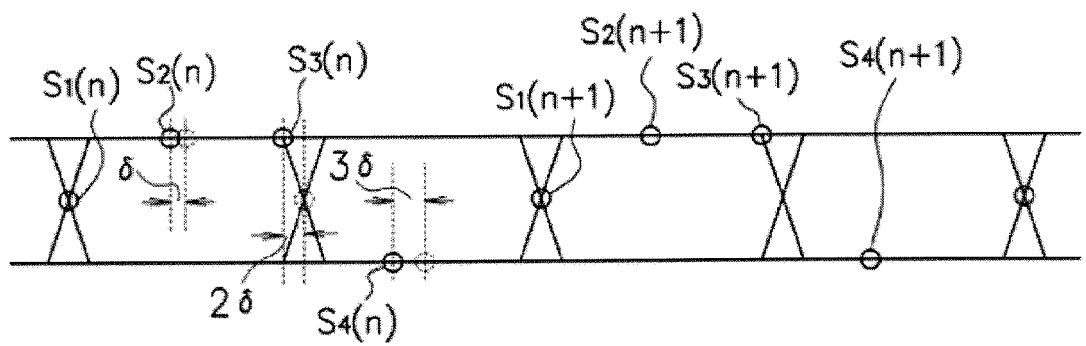
FIG. 7 depicts an example of an output of a signal processing circuit.

FIG. 7 depicts an example of outputs of a signal processing circuit. If the delay times between adjacent taps of the taps T1 to T4 of the delay line 101 deviate from 0.5 UI, the phase interval of the data signals S1(n) to S4(n) and S1(n+1) to S4(n+1) may deviate from 0.5 UI as depicted in FIG. 7. For example, the deviation in the phase of the data signal S1(n) may be 0, the deviation in the phase of the data signal S2(n) may be 6, the deviation in the phase of the data signal S3(n) may be 26, and the deviation in the phase of the data signal S4(n) may be 36. Similarly, the deviation in the phase of the data signal S1(n+1) may be 0, the deviation in the phase of the data signal S2(n+1) may be 6, the deviation in the phase of the data signal S3(n+1) may be 26, and the deviation in the phase of the data signal S4(n+1) may be 36. In this case, the deviation in the phase may become uneven and the interval between the phase of the data signal S4(n) and the phase of the data signal S1(n+1) may increase, possibly causing data restoration error.

Figure 8:
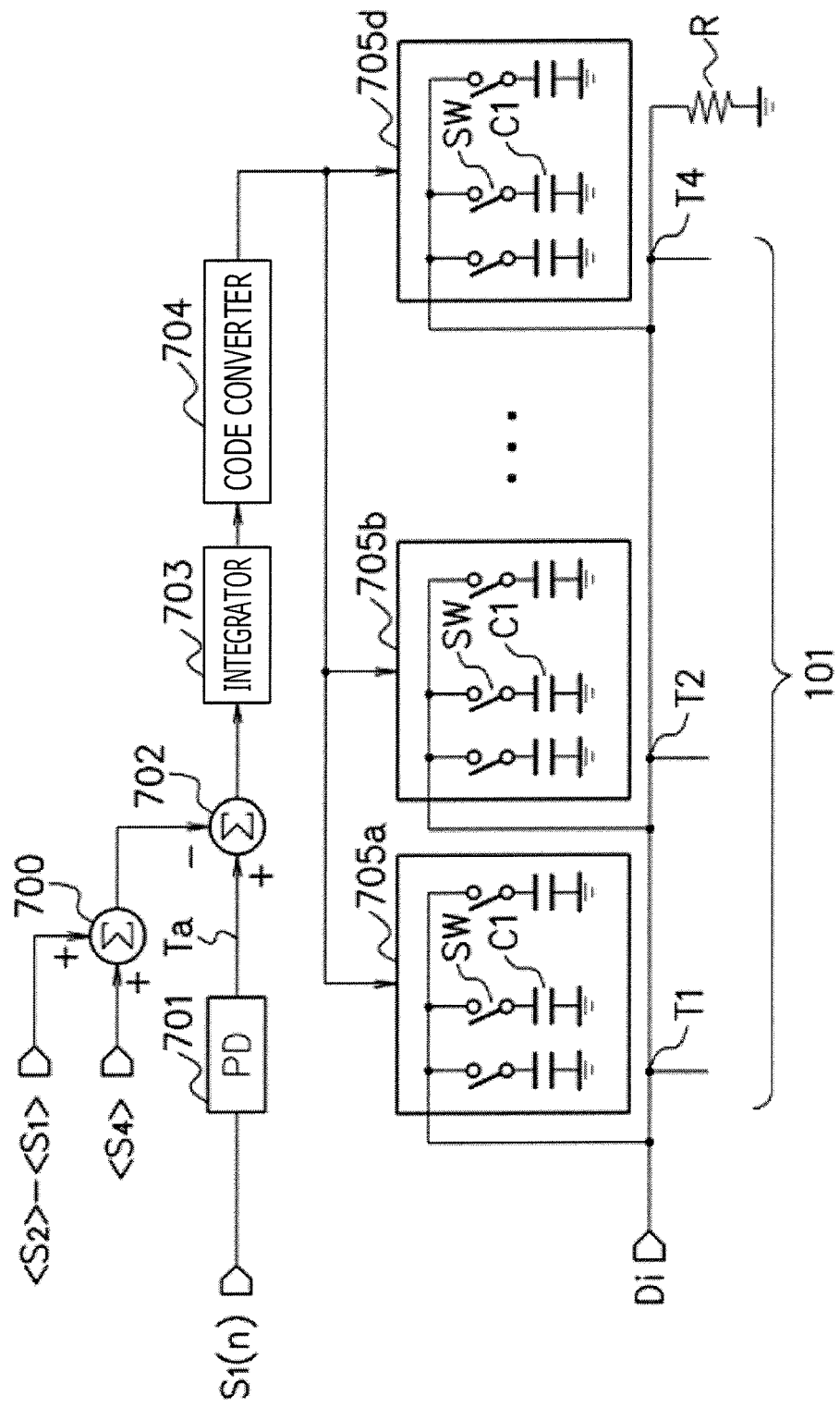
FIG. 8 depicts an example of an adjusting circuit.

FIG. 8 depicts an example of an adjusting circuit. The delay line 101 may correspond to the delay line 101 in FIG. 6A. A phase expected value <S1> may be a phase expected value of the data signal S1(n), <S2> may be a phase expected value of the data signal S2(n), and <S4> may be a phase expected value of the data signal S4(n). <S2>-<S1>, which is the phase obtained by subtracting the phase expected value <S1> of the data signal S1(n) from the expected value <S2> of the data signal S2(n), may correspond to the delay time between the tap T1 and the tap T2. An adder 700 adds the phase expected value <S4> and the inter-tap delay time <S2>-<S1>. The output phase of the adder 700 may be substantially the same as the phase of the data signal S1(n+1) if there is no deviation in the delay times between adjacent taps of the taps T1 to T4. The phase of the data signal S1(n+1) may be substantially the same as that of the data signal S1(n). Accordingly, the output phase of the adder 700 may be substantially the same as the phase of the data signal S1(n) if there is no deviation in the delay times between adjacent taps of the taps T1 to T4.

A phase detector 701 detects the phase Ta of the data signal S1(n). A subtracter 702 subtracts an output phase of the adder 700 from the phase Ta of the data signal S1(n) and outputs the result to an integrator 703. The integrator 703 integrates the output value from the subtracter 702 and outputs the result to a code converter 704. The code converter 704 converts the output value from the integrator 703 into control codes and outputs them to four capacity adjusting units 705a to 705d. The four capacity adjusting units 705a to 705d each include a circuit in which a plurality of switches (SW) and capacitors C1 are coupled in series, and are coupled to taps T1 to T4 of the delay line 101. The four capacity adjusting units 705a to 705d each control the turning on and off of switches according to the control code to adjust the capacitances coupled to the taps T1 to T4 of the delay line 101. The delay times between adjacent taps of the taps T1 to T4 are adjusted so that the output of the subtracter 702 substantially becomes 0. For example, as depicted in FIG. 6B, the phase interval of the data signals S1(n) to S4(n) and S1(n+1) to S4(n+1) may be adjusted to 0.5 UI and data restoration error may be reduced.

In the adjusting circuit, the deviation in the phases of output signals from the synchronization circuits 103a to 103h, is detected by the subtracter 702 and the delay time of the delay line 101 is adjusted depending on the detected deviation in the phases. Since the input analog data signal Di is sampled at certain intervals, timing margins during data restoration may be improved.

Figure 9:
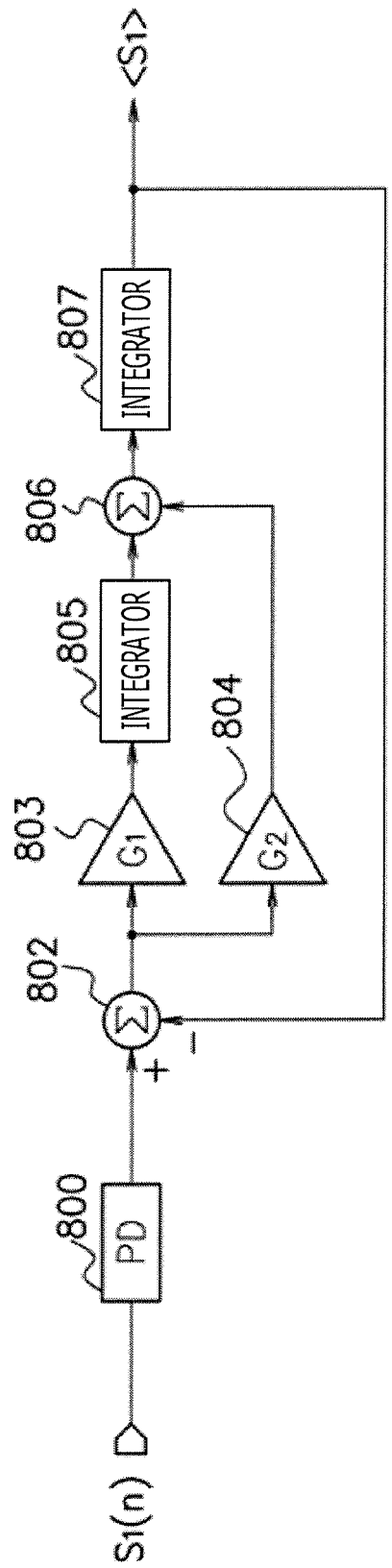
FIG. 9 depicts an example of a circuit for generating an expected value.

FIG. 9 depicts an example of a circuit for generating an expected value. The circuit depicted in FIG. 9 generates the phase expected value <S1> of the data signal S1(n) depicted in FIG. 8. A phase detector 800 detects the phase of the data signal S1(n). The phase of the data signal S1(n) is based on 0 UI. The subtracter 802 subtracts the phase expected value <S1> from the output value from the phase detector 800. Multipliers 803 and 804 multiply the output value from the subtracter 802 by coefficients G1 and G2, respectively. An integrator 805 integrates the output value from the multiplier 803. An adder 806 adds the output value from the integrator 805 and the output value from the multiplier 804. An integrator 807 integrates the output value from the adder 806 and outputs the phase expected value <S1> of the data signal S1(n). The phase expected value <S1> of the data signal S1(n) is calculated as the average value of the phases of the data signals S1(n) in past cycles. For example, when the data signals S2(n) and S4(n) are entered instead of the data signal S1(n), the phase expected value <S2> of the data signal S2(n) and the phase expected value <S4> of the data signal S4(n) are generated.

Figure 10:
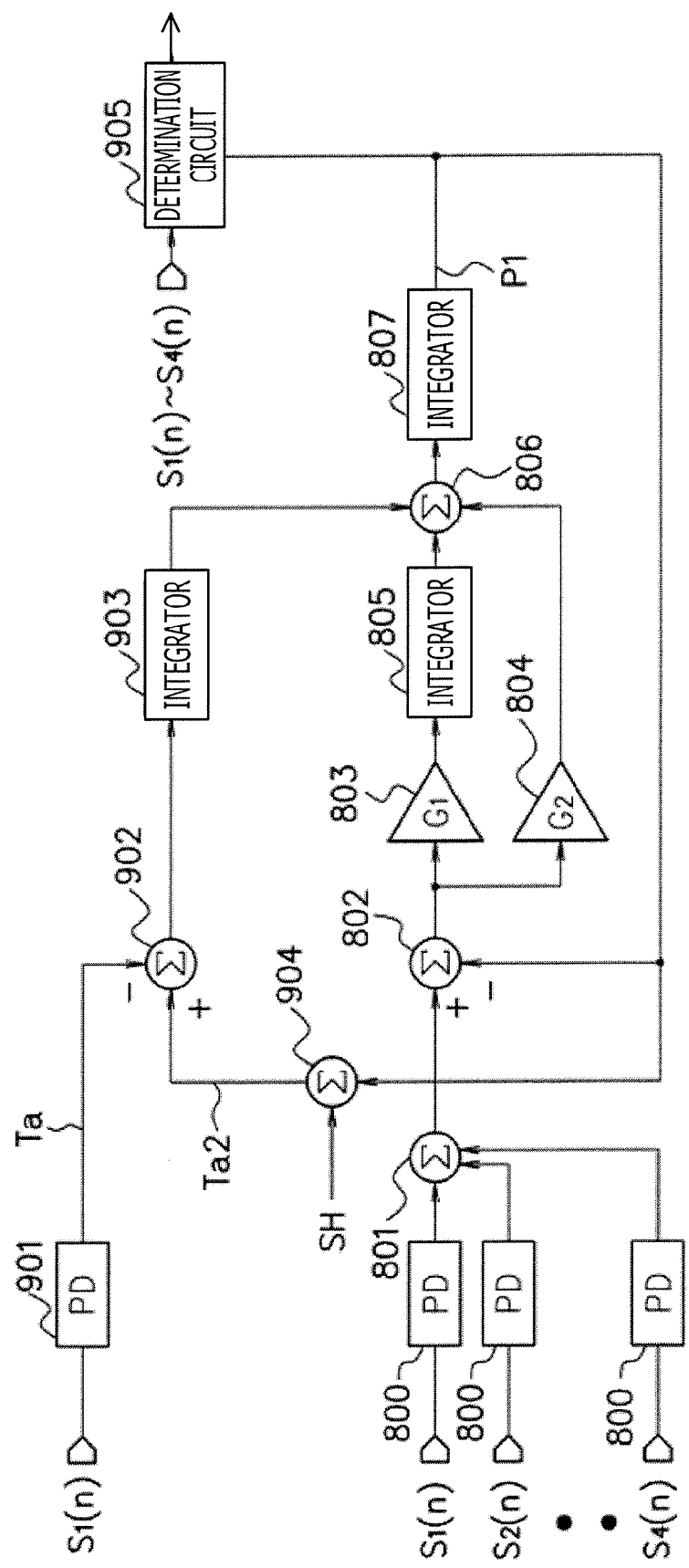
FIG. 10 depicts an example of a predicted value output circuit.

FIG. 10 depicts an example of a predicted value output circuit. In FIG. 10, the predicted value output circuit is disposed in place of the adjusting circuit depicted in FIG. 8. Since the other components in FIG. 10 are substantially the same as or similar to those in FIG. 8, their description may be omitted or reduced. In the predicted value output circuit in FIG. 10, an adder 801, a phase detector 901, a subtracter 902, an integrator 903, an adder 904, and a determination circuit 905 are added to the circuit in FIG. 9.

The phase detector 901 detects the phase Ta of the data signal S1(n). The subtracter 902 subtracts the phase Ta from an expected value Ta2. The integrator 903 integrates the output value from the subtracter 902. The four phase detectors 800 detect the phases of the four the data signals S1(n) to S4(n). The phase of the data signal S1(n) is based on the first bit 0 UI, the phase of the data signal S2(n) is based on the first bit 0.5 UI, the phase of the data signal S3(n) is based on the second bit 0 UI, and the phase of the data signal S4(n) is based on the second bit 0.5 UI. For example, if the delay times between adjacent taps of the taps T1 to T4 are 0.5 UI, the phases of the four data signals S1(n) to S4(n) may be substantially the same. The adder 801 adds the output values from the four phase detectors 800. The subtracter 802 subtracts a predicted value P1 from the output value from the adder 801 and outputs the result to the multipliers 803 and 804. The multipliers 803 and 804 multiply the output value from the subtracter 802 by coefficients G1 and G2. The integrator 805 integrates the output value from the multiplier 803. The adder 806 adds the output values from the integrator 903, the integrator 805, and the multiplier 804. The integrator 807 integrates the output value from the adder 806 and outputs the phase predicted value P1 of the data signal S1(n). The adder 904 adds the predicted value P1 and a shift amount SH and outputs an expected value Ta2. The predicted value P1 is a phase predicted value in consideration of deviation in the delay time. The shift amount SH may be a value corresponding to the deviation in the delay time and may be a known value that was preset. The expected value Tat is a phase expected value when there is no deviation in the delay time. The determination circuit 905 presumes the phases of the data signals S1(n) to S4(n) based on the phase predicted value P1 of the data signal S1(n), performs two-level determination of the data signals S1(n) to S4(n), and restores data. For example, the determination circuit 905 selects the data of a phase near the middle of 1 UI of each bit as described above and restores the data of each bit.

The predicted value output circuit detects a deviation in the phase of the output signal S1(n) using the subtracter 902, and outputs the phase predicted value P1 of the output signal S1(n) from the synchronization circuit 103a depending on the detected deviation in the phase.

As depicted in FIGS. 6A and 6B, with no circuit for adjusting the delay time of the delay line 101, the deviation in the phase of the data signal S1(n) from the average value of past phases is detected and the phase predicted value P1 is output, whereby effects of error of sampling intervals may reduce. Since the adjusting circuit in FIG. 8 may not be disposed, the size of the circuit may be reduced.

Figure 11A:
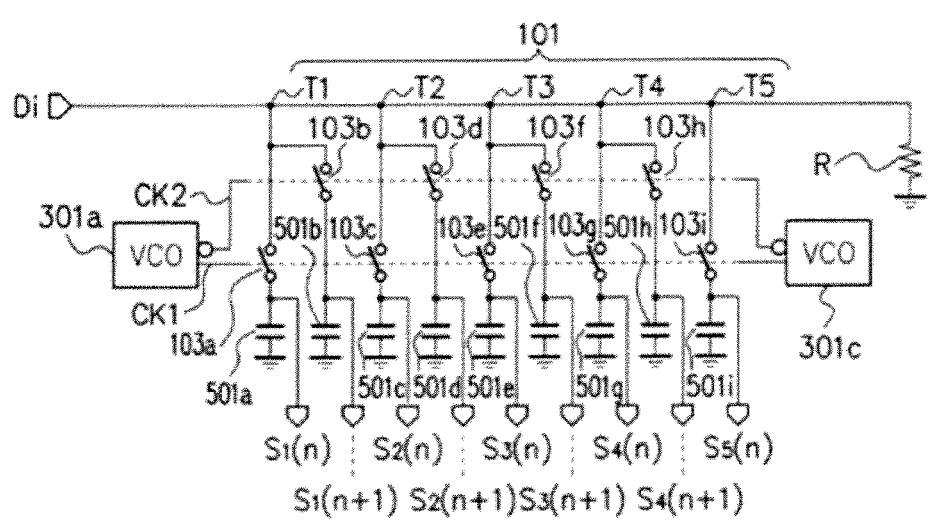
FIG. 11A depicts an example of a signal processing circuit.
Figure 11B:
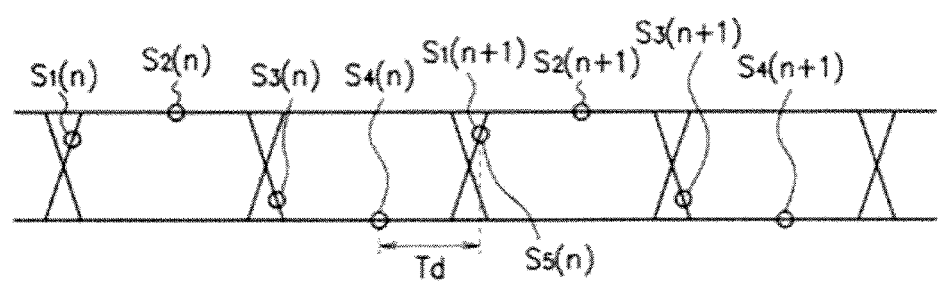
FIG. 11B depicts an example of an output of a signal processing circuit.

FIG. 11A depicts an example of a signal processing circuit. FIG. 11B depicts an example of the operation of the signal processing circuit. In FIG. 11A, a tap T5, a synchronization circuit 103i, and a capacitor C501i are added to the signal processing circuit in FIG. 6A. Since the structure in FIG. 11A is substantially the same as or similar to that in FIG. 6A, its description may be omitted or reduced.

The delay line 101 includes the tap T5 in addition to the taps T1 to T4. The delay time between the taps T4 and T5 may be Td (=0.5 UI). For example, the signal from the tap T5 may be, by delay time Td, later than the signal from the tap T4. The synchronization circuit 103i, which may have substantially the same structure as the synchronization circuits 103a to 103h, samples the signal from the tap T5 in sync with the leading edge of the clock signal CK1. The synchronization circuit 103i outputs a high level when the signal is larger than the threshold or outputs a low level when the signal is smaller than the threshold. For example, the voltage controlled oscillators 301a to 301c supply the clock signal CK1 to the synchronization circuit 103i. The capacitor C501i, which is coupled to the output terminal of the synchronization circuit 103i, holds the output signal from the synchronization circuit 103i and outputs the output signal as the data signal S5(n).

As depicted in FIG. 11B, the difference between the phase of the data signal S4(n) and the phase of the data signal S5(n) may be the delay time Td. Accordingly, if the delay time of the delay line 101 includes no deviation, the phase of the data signal S5(n) and the phase of the data signal S1(n+1) may be substantially the same. The delay time of the delay line 101 may be adjusted so that the phase of the data signal S5(n) and the phase of the data signal S1(n+1) are substantially the same.

Figure 12:
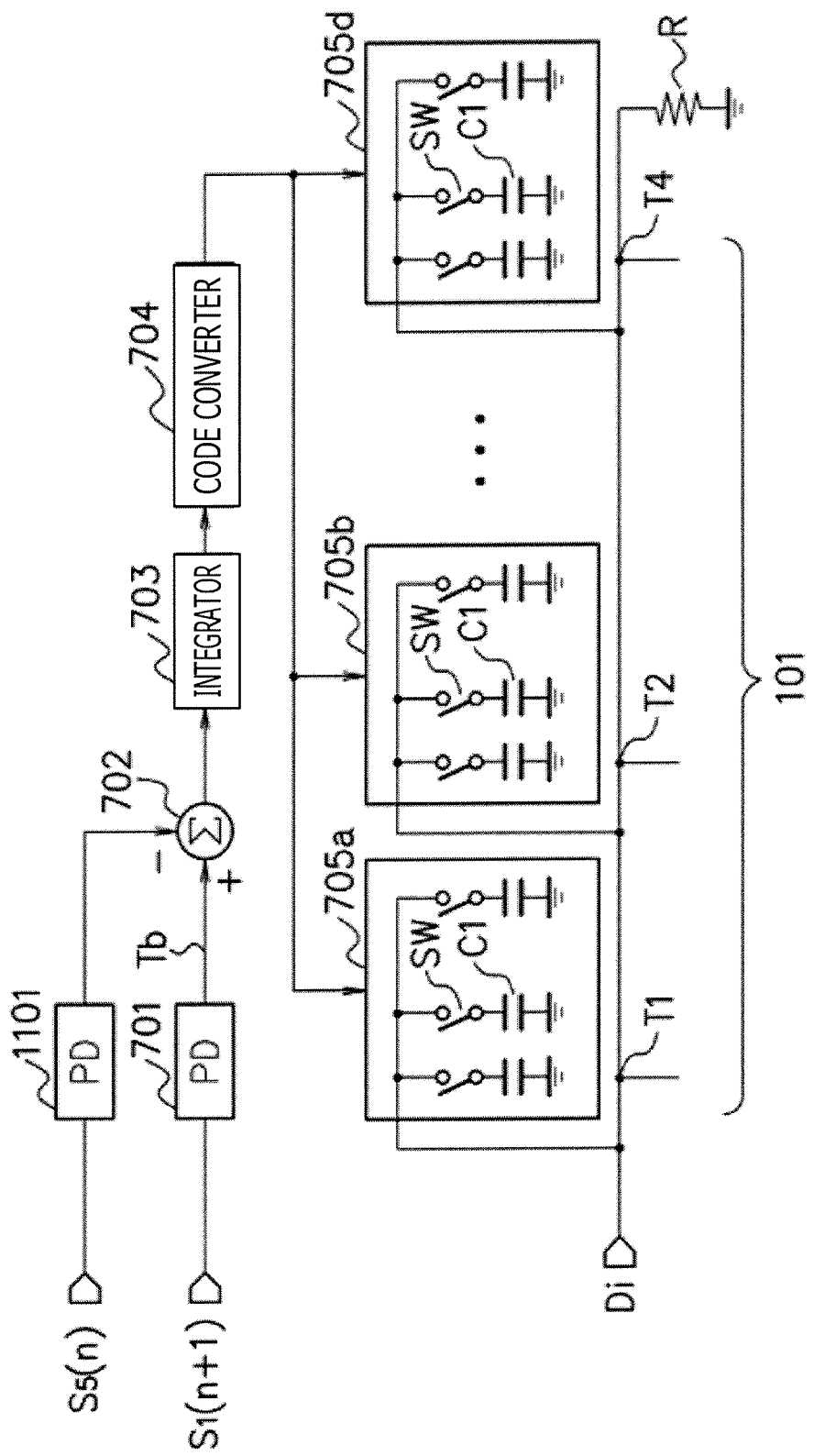
FIG. 12 depicts an example of an adjusting circuit.

FIG. 12 depicts an example of an adjusting circuit. The adjusting circuit depicted in FIG. 12 may be disposed in the signal processing circuit depicted in FIG. 11A. In FIG. 12, a phase detector 1101 is disposed in place of the adder 700 in the adjusting circuit depicted in FIG. 8. Since the structure in FIG. 12 is substantially the same as or similar to that in FIG. 8, its description may be omitted or reduced. The phase detector 1101 detects the phase of the data signal S5(n). The phase detector 701 detects the phase of the data signal S1(n+1). The subtracter 702 subtracts the phase of the data signal S5(n) from the phase Tb of the data signal S1(n+1) and outputs the result to the integrator 703. The integrator 703 integrates the output value from the subtracter 702 and outputs the result to the code converter 704. The code converter 704 converts the output value from the integrator 703 into control codes and outputs them to the four capacity adjusting units 705a to 705d. The four capacity adjusting units 705a to 705d each control the turning on and off of switches according to the control codes to adjust the capacitances coupled to the taps T1 to T4 of the delay line 101. The delay times between adjacent taps of the taps T1 to T4 are adjusted so that the difference between the phase Tb of the data signal S1(n+1) and the phase of the data signal S5(n) substantially becomes 0. As depicted in FIG. 11B, the phase interval of the data signals S1(n) to S4(n) and S1(n+1) to S4(n+1) may be adjusted to 0.5 UI and data restoration error may be reduced.

The adjusting circuit depicted in FIG. 12 adjusts the delay time of the delay line 101 depending on the deviation between the phase of the output signal S1(n+1) from the synchronization circuit 103b corresponding to the tap T1 with the minimum delay time of the delay line 101 and the phase of the output signal S5(n) from the synchronization circuit 103i corresponding to the tap T5 with the maximum delay time.

A five-tap delay line 101 having the taps T1 to T4 in FIG. 8 and an additional tap T5 is used. The fact may be utilized that the phase of a data signal S5(n) obtained from the tap T5 is substantially the same as the phase of the data signal S1(n+1) obtained from the tap T1 in a subsequent sampling interval. For example, the inter-tap delay time is adjusted so that the phase of the data signal S1(n+1) is substantially the same as the phase of a data signal S5($n$). For example, the two data signals S5($n$) and S1($n$+1) that have substantially the same phase are obtained by using an additional tap. Accordingly, the correction precision of phase error may become high and the timing margin of data determination may be improved.

In the adjusting circuits depicted in FIGS. 8 and 12, the delay time of the delay line 101 is adjusted. The phases of the clock signals CK1, CK2, and CK4 may be adjusted according to control codes so that the phase interval of the data signals S1($n$) to S4($n$) and S1($n$+1) to S4($n$+1) becomes 0.5 UI.

Since the delay line 101 and the synchronization circuits 103$a$ to 103$h$, or 201$a$ to 201$h$ are disposed, the data signal Di of a high data rate may be received. A plurality of data signals with different delay times are generated by the delay line 101, and the synchronization circuits 103$a$ to 103$h$ or 201$a$ to 201$h$ perform interleaving. Therefore, the number of phases of clocks CK1 and CK2 may be reduced, the generation and distribution of a clock signal may be facilitated, the power consumption and the area of a circuit may be reduced. In the above signal processing circuits, signal transmission between semiconductor chips, between circuit blocks in a cabinet, or between cabinets may be performed at high speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A signal processing circuit comprising:
    a delay line configured to output, to a plurality of taps, signals with different delay times obtained by delaying an input signal, respectively; and
    a plurality of synchronization circuits configured to sample the signals from the plurality of taps in a phase in synchronization with a clock signal,
    wherein each of the plurality of synchronization circuits samples a sample signal from one of the plurality of taps in different phases and outputs a plurality of output signals,
    wherein the plurality of synchronization circuits sample the signals from the plurality of taps, output sampled signals and include a plurality of analog-digital converters that perform analog-to-digital conversion of the sampled signals.

2. The signal processing circuit according to claim 1, wherein a cycle of the clock signal is longer than a maximum value of the delay times.

3. The signal processing circuit according to claim 1, wherein the plurality of synchronization circuits include:
    first synchronization circuits, coupled to the plurality of taps, configured to sample the sample signal in a first phase; and
    second synchronization circuits, coupled to the plurality of taps, configured to sample the sample signal in a second phase, which is different from the first phase.

4. The signal processing circuit according to claim 1, wherein the plurality of synchronization circuits output a first signal having a first level when the signals from the plurality of taps are larger than a threshold or output a second signal having a second level when the signals from the plurality of taps are smaller than the threshold.

5. The signal processing circuit according to claim 1, wherein each of the plurality of analog-digital converters performs analog-to-digital conversion of a sampled signal from one of the plurality of synchronization circuits in synchronization with the different phases and outputs the plurality of output signals.

6. The signal processing circuit according to claim 1, further comprising:
    a plurality of oscillators, coupled to each other, configured to distribute the clock signal to the plurality of synchronization circuits.

7. The signal processing circuit according to claim 1, further comprising:
    an adjusting circuit configured to detect a deviation between phases of the plurality of output signals and adjusts the delay time of the delay line according to the detected deviation between the phases.

8. The signal processing circuit according to claim 1, further comprising:
    a predicted value output circuit configured to detect a difference between phases of the plurality of output signals and outputs a predicted value of phases of the plurality of output signals according to the detected difference between phases.

9. The signal processing circuit according to claim 7, wherein the adjusting circuit adjusts the delay time of the delay line according to a deviation between a phase of an output signal of one of the synchronization circuits that corresponds to a tap with a minimum delay time and a phase of an output signal of one of the synchronization circuits that corresponds to a tap with a maximum delay time.

10. A signal processing method, comprising:
    delaying an analog signal via a delay line including delay elements and outputting analog signals with different delay times to a plurality of taps;
    sampling a signal from a first tap among the plurality of taps in a first phase that is in synchronization with a clock signal and outputting the first sampled signal;
    sampling the signal from the first tap in a second phase that is in synchronization with the clock signal and outputting the second sampled signal; and
    performing analog-to-digital conversion of the first sampled signal and the second sampled signal.

11. The signal processing method according to claim 10, wherein a cycle of the clock signal is longer than a maximum value of the delay times.

* * * * *